United States Patent
Cassagnes et al.

(10) Patent No.: US 10,263,608 B2
(45) Date of Patent: Apr. 16, 2019

(54) FILTERED SAMPLING CIRCUIT AND A METHOD OF CONTROLLING A FILTERED SAMPLING CIRCUIT

(71) Applicant: FREESCALE SEMICONDUCTOR, INC., Austin, TX (US)

(72) Inventors: Thierry Dominique Yves Cassagnes, Tournefeuille (FR); Joel Cameron Beckwith, Tokyo (JP); Jerome Romain Enjalbert, Tournefeuille (FR); Dejan Mijuskovic, Toulouse (FR)

(73) Assignee: NXP USA, Inc., Austin, TX (US)

( * ) Notice: Subject to any disclaimer, the term of this patent is extended or adjusted under 35 U.S.C. 154(b) by 266 days.

(21) Appl. No.: 14/847,334

(22) Filed: Sep. 8, 2015

(65) Prior Publication Data
US 2016/0301403 A1 Oct. 13, 2016

(30) Foreign Application Priority Data

Apr. 7, 2015 (WO) .................. PCT/IB2015/000628

(51) Int. Cl.
*H03K 5/22* (2006.01)
*H03F 3/45* (2006.01)
(Continued)

(52) U.S. Cl.
CPC .......... *H03K 5/22* (2013.01); *H03F 3/45475* (2013.01); *H03M 1/1245* (2013.01); *G01P 15/18* (2013.01);
(Continued)

(58) Field of Classification Search
CPC .. H03K 5/22; H03K 5/24–5/249; H03K 5/26; H03F 3/45076; H03F 3/4508; H03F 3/45085; H03F 3/45089; H03F 3/45094; H03F 2203/45116; H03F 2200/165; G01P 15/18; G01P 15/08; G01P 15/0802; G01P 2015/0805–2015/086; G01P 2015/0862–2015/0882; H03M 1/1245; H03M 1/125; H03M 1/1255; H03M 1/126;
(Continued)

(56) References Cited

U.S. PATENT DOCUMENTS

| 6,614,286 | B1 * | 9/2003 | Tang ...................... G06G 7/184 327/337 |
| 7,348,838 | B2 * | 3/2008 | Ranganathan .......... H04B 1/30 327/307 |

(Continued)

*Primary Examiner* — Patrick C Chen

(57) ABSTRACT

A circuit comprises an amplifier, a first switch arranged between an amplifier input and an amplifier output, a first capacitor, a first resistor, a second switch, a third switch, a first converter coupled to the first amplifier output, a register storing a last digital value, a second converter converting the stored last digital value into a corresponding voltage value, and a control circuit. The control circuit charges the first capacitor to the corresponding voltage value by coupling a second converter output to a second capacitor terminal and switching on the first switch, or by coupling the second converter output to the first capacitor terminal and switching on the third switch; switches on the first switch and the second switch for providing the input voltage signal to the first capacitor; and switches on the third switch for determining a subsequent digital value of the converted output amplifier signal.

14 Claims, 7 Drawing Sheets

(51) Int. Cl.
    *H03M 1/12*         (2006.01)
    *H03M 1/46*         (2006.01)
    *G01P 15/18*       (2013.01)

(52) U.S. Cl.
    CPC .......... *H03F 2200/165* (2013.01); *H03F 2203/45116* (2013.01); *H03F 2203/45534* (2013.01); *H03M 1/1225* (2013.01); *H03M 1/468* (2013.01)

(58) Field of Classification Search
    CPC ... H03M 1/1265; H03M 1/127; H03M 1/1275
    USPC .......................................................... 327/95
    See application file for complete search history.

(56) References Cited

U.S. PATENT DOCUMENTS

| | | | |
|---|---|---|---|
| 7,948,244 B2 | 5/2011 | Mijuskovic et al. | |
| 8,497,731 B1 | 7/2013 | Beckwith et al. | |
| 2005/0260965 A1* | 11/2005 | Ranganathan | H04B 1/30 455/296 |
| 2011/0001492 A1* | 1/2011 | Nys | H03M 1/123 324/658 |
| 2013/0265181 A1* | 10/2013 | Haneda | H03M 1/12 341/110 |
| 2013/0331052 A1* | 12/2013 | Jensen | H03M 3/396 455/230 |
| 2015/0188561 A1* | 7/2015 | Narayan | H03M 1/0604 341/118 |

\* cited by examiner

FILTERED SAMPLING CIRCUIT AND A METHOD OF CONTROLLING A FILTERED SAMPLING CIRCUIT

CROSS REFERENCE TO RELATED APPLICATION(S)

The present application claims priority to International Patent Application No. PCT/IB2015/000628, entitled "A FILTERED SAMPLING CIRCUIT AND A METHOD OF CONTROLLING A FILTERED SAMPLING CIRCUIT," filed on Apr. 7, 2015, the entirety of which is herein incorporated by reference.

FIELD OF THE INVENTION

This invention relates to a filtered sampling circuit, an integrated circuit, an accelerometer, and a method of controlling a filtered sampling circuit.

BACKGROUND OF THE INVENTION

It is known that in order to reconstruct a signal by performing digital sampling, the sampling rate (the so-called Nyquist frequency) should be at least twice the maximum frequency component of the signal of interest (Nyquist sampling theorem). However, electrical circuits generate and can pick up noise. Noise is undesirable and can contain signal components with frequency higher than the maximum frequency component of the signal of interest. These components may then alias into the frequency range of the signal of interest and thus lead to erroneous sampling results.

To ensure that the frequency range of the signal of interest is limited, a filtered sampling circuit, i.e. a low pass filter that passes low frequency components but attenuates the high frequency components, is added during sampling the signal. This low pass filter prevents the high frequency components from being sampled by attenuating signal components with frequency higher than the Nyquist frequency.

Filtered sampling circuits are commonly used to sample the signal at a predetermined sampling rate and at the same time to filter the sampled signal with a predetermined cut off frequency. The cut-off frequency of the filtered sampling circuit depends on the sampling rate, an observation time, i.e. the time during which the input signal is fed continuously to the filtered sampling circuit and a time constant of the filtered sampling circuit.

At low sampling rates (low operational frequency), the filtered sampling circuits need to work with a very large time constant. The input signal needs to be held, e.g. by a large capacitor, for a relatively long observation time. The large capacitor holding the charge can leak and lead to overall inaccuracy in the digital sampling process.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

Figure 1:
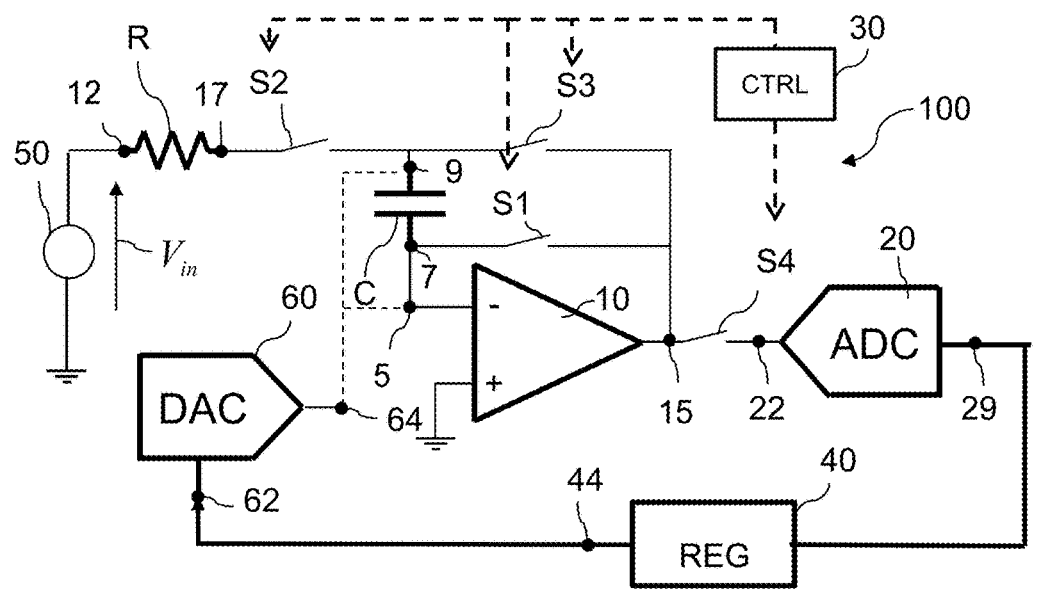
FIG. 1 schematically shows an equivalent circuit of a first example of a filtered sampling circuit, FIG. 2 schematically shows a timing diagram illustrating a cycle of operation of the circuit shown in FIG. 1, FIG. 3 schematically shows a prior art example of a filtered sampling circuit.

FIG. 1 schematically shows an equivalent circuit of a first example of a filtered sampling circuit 100 according to an embodiment of the present invention.

The filtered sampling circuit 100 may be used in any application where sampling of a digital signal is performed while at the same time attenuation of relatively high frequency noise components is required. For example, the filtered sampling circuit 100 may be used, as it will be seen later, in accelerometer devices capable to sense motion in the three dimensional space. Such accelerometers can be embedded in mobile phones for detecting speed or activity, in a gaming console to provide a more realistic gaming experience to the user of the gaming console, and in any other suitable device for a variety of purposes.

The filtered sampling circuit 100 includes an amplifier 10 having a first amplifier input 5 and a first amplifier output 15. The amplifier 10 may be an operational amplifier wherein the first amplifier input 5 is the inverting input of the operational amplifier. The non-inverting input 15 may be connected to the ground potential. The filtered sampling stage 100 further comprises a first switch S1, a first capacitor C, a first resistor R, a second switch S2, a third switch S3, a fourth switch S4, a control circuit 30, and a first converter 20.

The first switch S1 is configured to selectively couple the amplifier input 5 to the amplifier output 15. The first capacitor C has a first capacitor terminal 7 electrically coupled to the amplifier input 5, and a second capacitor terminal 9. The filtered sampling stage 100 comprises a first resistor R having a first resistor terminal 12 configured to receive an input voltage signal $V_{in}$, and a second resistor terminal 17 electrically coupled to the second capacitor terminal 9 via the second switch S2. For example, the first resistor terminal 12 may be electrically coupled to a first terminal of a voltage source 50 which is arranged to generate the input voltage signal $V_{in}$. The third switch S3 selectively couples the second capacitor terminal 9 to the first amplifier output 15. The control circuit 30 is arranged to control the first switch S1, the second switch S2, the third switch S3 and the fourth switch S4. The first converter 20 has a first converter input 22 electrically coupled to the first amplifier output 15 and a first converter output 29. The first converter input 22 receives an amplifier output signal. The first converter output 29 outputs a digital signal based on the output amplifier signal. The fourth switch S4 selectively couples the amplifier output 15 to the first converter input 22.

The filtered sampling circuit 100 further comprises a register 40 for storing a first digital value of the digital signal which is the output amplifier signal converted into the digital domain, and a second converter 60 for converting the first digital value into a corresponding voltage value. The second converter 60 comprises a second converter input 62 electrically coupled to an output 44 of the register 40 and a second converter output 64. The control circuit 30 can be arranged to electrically couple the second converter output 64 to one of the first capacitor terminal 7 or second capacitor terminal 9 for charging the first capacitor C to the corresponding voltage value (see dashed line in FIG. 1).

The fourth switch S4 may be implemented in any manner suitable for the specific implementation. For example, the fourth switch S4 may be arranged to selectively couple the amplifier output 15 to the first converter input 22 as shown in FIG. 1. Alternatively, the fourth switch S4 may be arranged at the first converter output 29 to selectively couple the first converter output 29 to the register 40 or to an external output of the filtered sampling circuit 100.

The functionality of the filtered sampling circuit 100 will be described with reference to the timing diagram 250 shown in FIG. 2.

Figure 2:
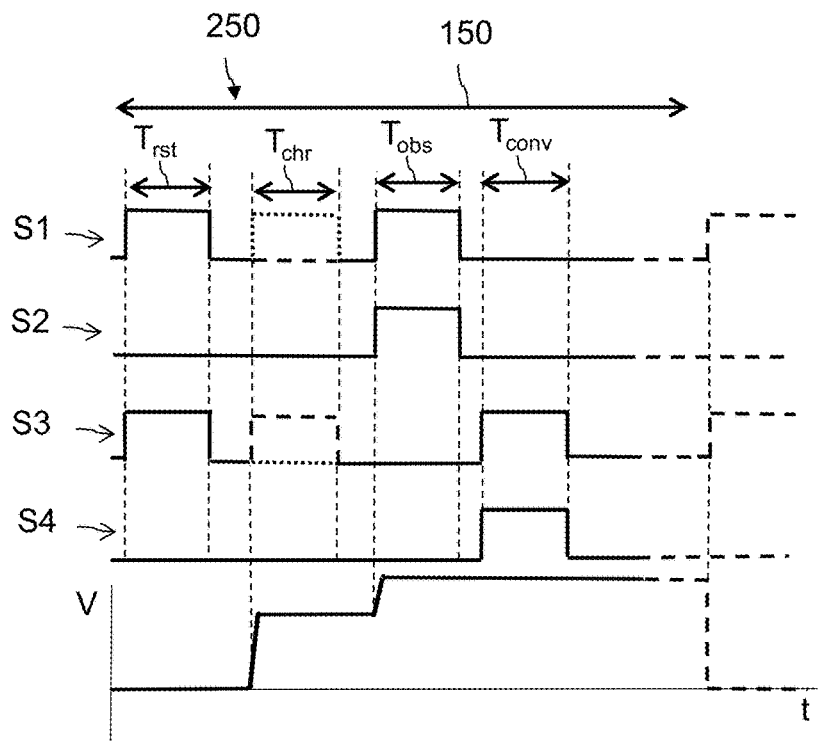

FIG. 2 schematically shows a timing diagram 250 illustrating a cycle of operation 150 of the circuit shown in FIG. 1. From top to bottom are shown the control signals controlling the first switch S1, the second switch S2, the third switch S3 and the fourth switch S4, respectively. The bottommost of the curves illustrates the voltage across the first capacitor C during the cycle of operation 150.

During the cycle of operation 150, the control circuit 30 is configured to sequentially charge the first capacitor C to the corresponding voltage value, e.g. during a predetermined charge time $T_{chr}$, providing the input voltage signal $V_{in}$ to the first capacitor C, e.g. during a predetermined observation time $T_{obs}$, and determine a subsequent digital value of the converted output amplifier signal, e.g. during a predetermined conversion time $T_{conv}$.

For charging the first capacitor C to the corresponding voltage value, the control circuit 30 is configured to either electrically couple the second converter 64 to the second capacitor terminal 9 and switch on the first switch S1, or electrically couple the second converter output 64 to the first capacitor terminal 7 and switch on the third switch S3.

For providing the input voltage signal $V_{in}$ to the first capacitor C, the control circuit 30 is arranged, after charging the capacitor C, to switch on the first switch S1 and the second switch S2.

For determining the subsequent digital value of the converted output amplifier signal, the control circuit 30 is configured, after providing the input voltage signal to the first capacitor C, to switch on the third switch S3 and the fourth switch S4.

Before charging the first capacitor C, the control circuit 30 may be configured to switch on the first switch S1 and the third switch S3 to reset the first capacitor C, e.g. during the predetermined reset time $T_{rst}$.

During the predetermined reset time $T_{rst}$, the first capacitor C may be short circuited at both the first and second capacitor terminals 7 and 9 such that the voltage across the first capacitor C is initially substantially zero Volts. This is shown in the first part of the bottommost curve of the timing diagram 250. After the first capacitor C has been reset and before a first observation cycle $T_{obs}$ can start, the first capacitor C is pre-charged to a voltage value outputted by the second converter 60 and corresponding to the last digital value of the output signal stored in the register 40. The last digital value stored is the last digital value sampled by the first converter 20. In other words, before each new observation cycle, the first capacitor C is pre-charged to a voltage value corresponding to a previous sampled output voltage value. The digital value of this previous sampled output voltage value is stored in the register 40. Since a voltage is not directly stored in the first capacitor C during the observation time $T_{obs}$, as it instead typically occurs in prior art circuits discussed later, sampling of the output signal is not affected by the leakage in the first capacitor C. The last sampled output voltage value is converted by the first converter 20 and stored digitally immediately after the predetermined observation time $T_{obs}$, such that the sampled output voltage is retained digitally in the register 40 without leakage.

After the predetermined conversion time $T_{conv}$ has passed, the first converter 20 samples a new subsequent digital value of the output signal. The new subsequent digital value can be stored in the register 40 and a new cycle of operation can start wherein the first capacitor C is pre-charged to a voltage value corresponding to the new subsequent digital value.

Since the first capacitor C can, in each cycle of operation, reset to a substantially zero Volt level, the first capacitor C can be pre-charged each time to a new voltage value independent of the voltage value it had at the end of the last predetermined observation time $T_{obs}$. This means that the same first capacitor C can be re-used, during different cycles of operations 150, to process independently more than one signal at different amplitude levels.

Figure 3:
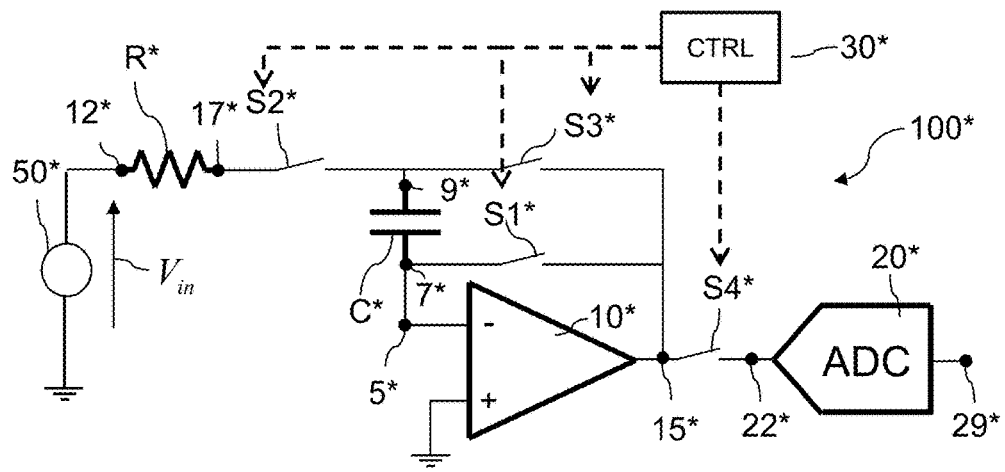

FIG. 3 schematically shows a prior art example of a filtered sampling circuit 100*. Circuit parts of the filtered sampling circuit 100* which correspond to circuit parts of the filtered sampling circuit 100 have been named with the same number or letter but with the asterisk sign.

The filtered sampling stage 100* comprises an amplifier 10* having a first amplifier input 5* and a first amplifier output 15*. The amplifier 10* may be an operational amplifier wherein the first amplifier input 5* is the inverting input of the operational amplifier. The non-inverting input may be connected to the ground potential. The filtered sampling stage 100* comprises a first switch S1*, a first capacitor C*, a first resistor R*, a second switch S2*, a third switch S3*, a fourth switch S4*, a control circuit 30* and a first converter 20*.

The first switch S1* is configured to selectively couple the amplifier input 5* to the amplifier output 15*. The first capacitor C* has a first capacitor terminal 7* electrically coupled to the amplifier input 5*, and a second capacitor terminal 9*. The filtered sampling stage 100* comprises a first resistor R* having a first resistor terminal 12* configured to receive an input voltage signal $V_{in}$, and a second resistor terminal 17* electrically coupled to the second capacitor terminal 9* via the second switch S2*. For example, the first resistor terminal 12* may be electrically coupled to a first terminal of a voltage source 50* which is arranged to generate the input voltage signal $V_{in}$. The third switch S3* selectively couples the second capacitor terminal 9* to the first amplifier output 15*. The control circuit 30* is configured to control the first switch S1*, the second switch S2*, the third switch S3* and the fourth switch S4*. The first converter 20* has a first converter input 22* electrically coupled to the first amplifier output 15\* and a first converter output 29\*. The first converter input 22\* receives an amplifier output signal. The first converter output 29\* outputs a digital signal based on the output amplifier signal. The fourth switch S4\* selectively couples the amplifier output 15\* to the first converter input 22\*.

Figure 4:
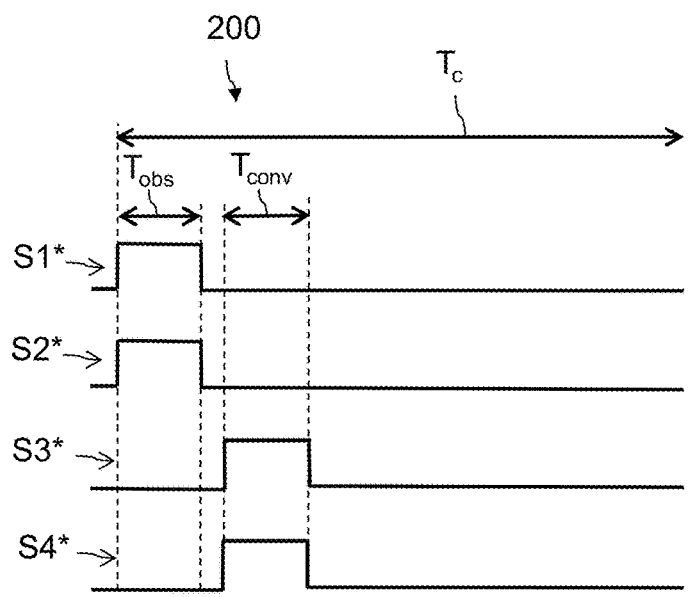
FIG. 4 shows a timing diagram illustrating a cycle of operation of the circuit shown in FIG. 3, FIG. 5 schematically shows an equivalent circuit of a second example of a filtered sampling circuit, FIG. 6 schematically shows a voltage versus time diagram, illustrating a cycle of operation of the circuit shown in FIG. 5, FIG. 7 schematically shows an equivalent circuit of a third example of a filtered sampling circuit, FIG. 8 schematically shows an equivalent circuit of a fourth example of a filtered sampling circuit, FIG. 9 schematically shows a timing diagram of a predetermined charge time, FIG. 10 schematically shows an equivalent circuit of a fifth example of a filtered sampling circuit, FIG. 11 schematically shows an equivalent circuit of a sixth example of a filtered sampling circuit, FIG. 12 schematically shows an example of accelerometer, FIG. 13 schematically shows a flow diagram of a method of controlling a filtered sampling circuit.

Operation of the filtered sampling circuit 100\* will be herewith described with reference to the timing diagram 200 of FIG. 4.

The timing diagram 200 illustrates a current cycle of operation $T_c$ of the filtered sampling circuit 100\*. From top to bottom are shown the control voltages applied to the first switch S1\*, second switch S2\*, third switch S3\*, and fourth switch S4\*. The current cycle of operation $T_c$ may be preceded by a previous cycle of operation and succeeded by a subsequent cycle of operation in which the control voltages shown may be repeated.

During a predetermined observation time $T_{obs}$, the first switch S1\* and the second switch S2\* are switched on. When the second switch S2\* is switched on, the input voltage $V_{in}$ is directly electrically coupled to the second capacitor terminal 9\* via the first resistor R\*. When the first switch S1\* is switched on, the first capacitor terminal 7\* is directly electrically coupled to the virtual ground of the operational amplifier. The virtual ground is provided by the non-inverting input being connected to the ground potential and the operational amplifier being operating in a buffer configuration with its inverting input 5\* connected to the amplifier output 15\*. During the observation time $T_{obs}$, the input voltage $V_{in}$ is applied to the series of the first resistor R\* and first capacitor C\* so that the first capacitor C\* can be charged with a time constant defined by the value of the first resistor R\* and the value of the first capacitor C\*. During a conversion time $T_{conv}$, the third switch S3\* and the fourth switch S4\* are switched on while the first switch S1\* and the second switch S2\* are off such that the charge accumulated in the first capacitor C\* during the observation time $T_{obs}$ can be held across the first capacitor C\* and the voltage across it can be converted by the first converter 20\* into a digital value.

The filtered sampling circuit 100\* has a cut-off frequency $F_c$ defined by the following equation:

$$F_c = \frac{1}{2\pi R^* C^*} \frac{T_{obs}}{T_c}$$

In order for the filtered sampling circuit 100\* to act as a low pass filter for attenuating low frequency components of the input signal, the time constant R\*C\* of the circuit may be relatively large. E.g. the first resistor R\* may have a value in the range of several mega Ohms and the first capacitor C\* in the range of several pico Farads. The first capacitor C\* acts as an analogue memory whose charge is held during the conversion time $T_{conv}$. However, due to the large time constant, it may take several cycles, i.e. several observation times $T_{obs}$, before the first capacitor C\* is charged to the input voltage $V_{in}$. The voltage across the capacitor C\* cannot be held for long time because the first capacitor C\* has inherently some leakage. Furthermore, during each cycle, the voltage across the first capacitor C\* changes, because the input voltage $V_{in}$ changes over time, which means that the voltage across the first capacitor C\* can be used for processing only one signal.

The filtered sampling circuit 100 shown in FIG. 1 solves the above mentioned problems of the prior art circuit 100\* by storing the last sampled digital value in the register 40 and not directly in the first capacitor C\*.

Figure 5:
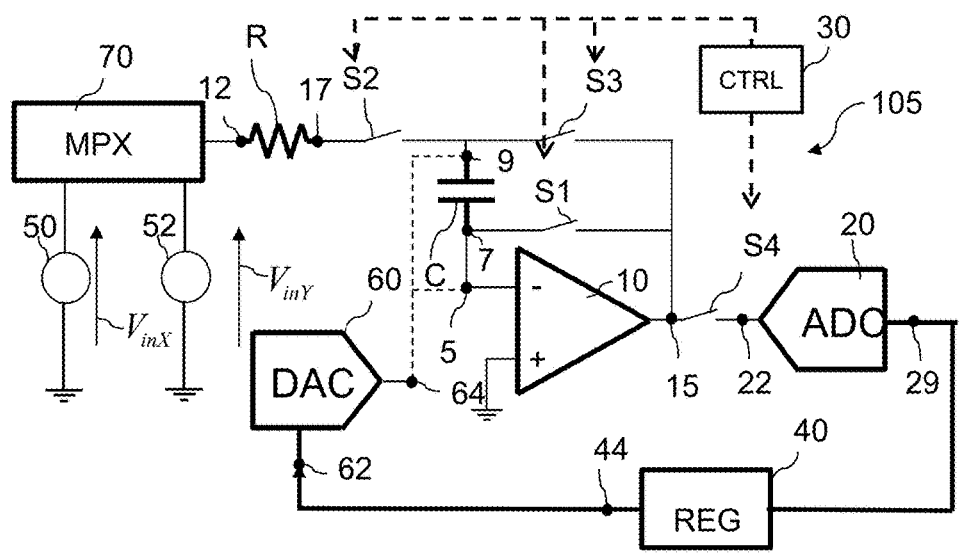

FIG. 5 schematically shows an equivalent circuit of a second example of a filtered sampling circuit 105. The filtered sampling circuit 105 differs from the filtered sampling circuit 100 shown in FIG. 1 in that the filtered sampling circuit comprises a multiplexer 70. The first resistor terminal 12 is arranged to receive the input voltage signal and one or more additional input voltage signals via the multiplexer 70. One or more additional input voltages may be multiplexed by the multiplexer 70. In the example shown in FIG. 5, only two input voltages $V_{inX}$ and $V_{inY}$ are multiplexed. The voltage source 50 generates an input voltage $V_{inX}$ and an additional voltage source 52 generates an additional input voltage $V_{inY}$. The input voltage $V_{inX}$ and the additional input voltage $V_{inY}$ are multiplexed via the multiplexer 70 such that either the input voltage source 50 or the additional input voltage source 52 is alternately electrically connected to the first resistor terminal 12. The first capacitor C may be shared between two, or in case of more than one additional input voltage, more than two signal processing paths, e.g. channels, in a specific application.

Since the first capacitor C may be shared between multiple channels, only one filtered sampling circuit may be used for multiple channels, thereby reducing size and manufacturing costs for multiple channels applications.

Figure 6:
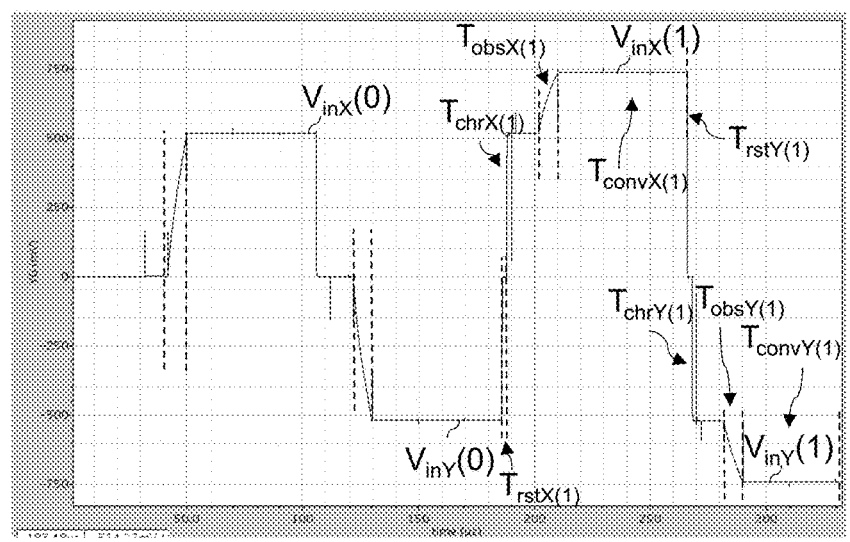

FIG. 6 schematically shows a voltage versus time diagram, illustrating a cycle of operation of the circuit shown in FIG. 5 for two channels, X and Y. The voltage shown is measured across the first capacitor C. The input voltage $V_{inX}$ may be associated to the channel X. The additional input voltage $V_{inY}$ may be associated to the channel Y. Both input voltages may have a constant voltage value, e.g. of 900 mV. The multiplexer 70 of FIG. 5 may alternately switch the voltage source 50 of channel X and the additional voltage source 52 of channel Y such that the input voltage $V_{inX}$ and the additional input voltage $V_{inY}$ are alternately fed to the first capacitor C via the first resistor R.

For channel X, the corresponding voltage of the last digital converted value X(0) retained in the register 40 is $V_{inX}(0)$.

For channel Y, the corresponding voltage of the last digital converted value Y(0) retained in the register 40 is $V_{inY}(0)$.

During a first predetermined reset time $T_{rstX(1)}$ for channel X, the control circuit 30 switches on the first switch S1 and the third switch S3 such that the first capacitor C is reset.

After the first predetermined reset time $T_{rstX(1)}$ for channel X has passed, the control circuit 30 couples the second converter output 64 to the second capacitor terminal 9 and switches on the first switch S1 for charging the first capacitor C to the corresponding voltage value $V_{inX}(0)$ of channel X, e.g. during a first predetermined charge time $T_{chrX(1)}$. Alternatively, the control circuit 30 couples the second converter output 64 to the first capacitor terminal 7 and switches on the third switch S3 for charging the first capacitor C to the corresponding voltage value $V_{inX}(0)$ of channel X, during the first predetermined charge time $T_{chrX(1)}$.

After the first predetermined charge time $T_{chrX(1)}$ for channel X has passed, the control circuit 30 switches on the first switch S1 and the second switch S2 during e.g. a first predetermined observation time $T_{obsX(1)}$ for providing the input voltage signal $V_{inX}$ to the first capacitor C.

After the first predetermined observation time $T_{obsX(1)}$ for channel X has passed, the control circuit 30 switches on the third switch S3 and the fourth switch S4 during e.g. a first predetermined conversion time $T_{convX(1)}$ for determining a subsequent digital value X(1) of the converted output amplifier signal for channel X. The subsequent digital value for channel X is then retained in the register 40 and converted by the second converter 60 to a second corresponding voltage value $V_{inX}(1)$ shown in FIG. 6.

The cycle is then repeated for channel Y.

During a first predetermined reset time $T_{rstY(1)}$ for channel Y, the control circuit 30 switches on the first switch S1 and the third switch S3 such that the first capacitor C is reset.

After the first predetermined reset time $T_{rstY(1)}$ for channel Y has passed, the control circuit 30 couples the second converter output 64 to the second capacitor terminal 9 and switches on the first switch S1 for charging the first capacitor C to the corresponding voltage value $V_{inY}(0)$ e.g. during a first predetermined charge time $T_{chrY(1)}$. Alternatively, the control circuit 30 couples the second converter output 64 to the first capacitor terminal 7 and switches on the third switch S3 for charging the first capacitor C to the corresponding voltage value $V_{inY}(0)$ of channel Y e.g. during the first predetermined charge time $T_{chrY(1)}$.

After the first predetermined charge time $T_{chrY(1)}$ for channel Y has passed, the control circuit 30 switches on the first switch S1 and the second switch S2 during a first predetermined observation time $T_{obsY(1)}$ for providing the input voltage $V_{inY}$ to the first capacitor C.

After the first predetermined observation time $T_{obsY(1)}$ for channel Y has passed, the control circuit 30 switches on the third switch S3 and the fourth switch S4 e.g. during a first predetermined conversion time for determining a subsequent digital value Y(1) of the converted output amplifier signal for channel Y. The subsequent digital value for channel Y is then retained in the register 40 and converted by the second converter to a second corresponding voltage value $V_{inY}(1)$.

For channel X, the voltage across the first capacitor C is progressively converging to $V_{inX}$, e.g. to 900 mV. For channel Y, the voltage across the first capacitor C is progressively converging to $V_{inY}$, e.g. to −900 mV.

Figure 7:
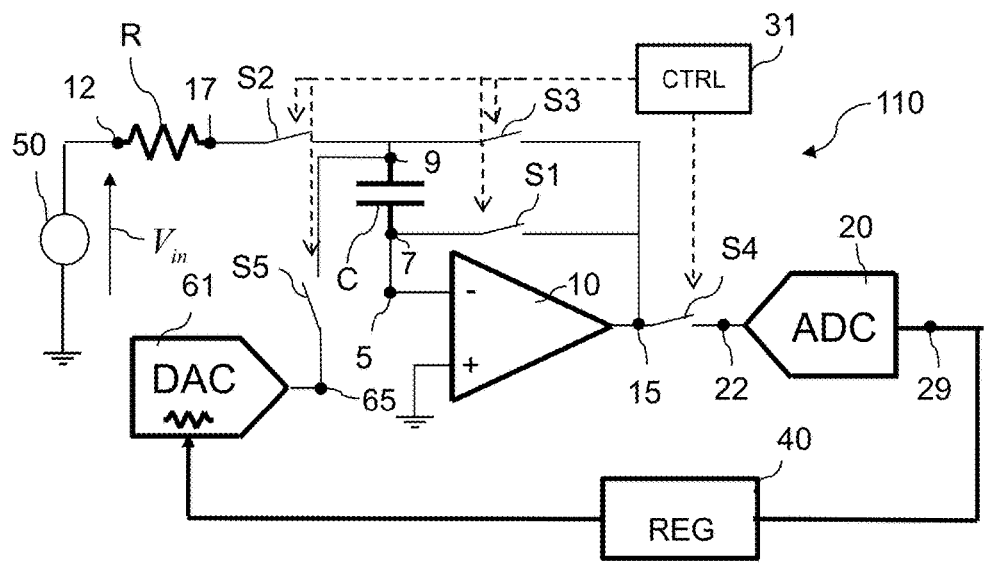

FIG. 7 schematically shows a circuit of a third example of a filtered sampling circuit 110, according with embodiments of the present invention. The filtered sampling circuit 110 differs from the filtered sampling circuit 100 in that the filtered sampling circuit 110 further comprises a fifth switch S5 configured to selectively couple the second converter output 65 to the second capacitor terminal 9.

The filtered sampling circuit 110 comprises a second converter 61. The second converter 61 may be a resistive digital to analogue converter. For example, the resistive converter may use a resistive ladder to generate a voltage value corresponding to each inputted digital value. The resistive ladder may be a R-2R resistive ladder, i.e. a resistive ladder using only two resistor values, or any other ladder type suitable for the specific implementation. A R-2R resistive ladder may be more easily and better fabricated and integrated on chip.

The control circuit 31 is configured to switch on the first switch S1 and the fifth switch S5 e.g. during the predetermined charge time $T_{chr}$. During the predetermined charge time $T_{chr}$, the operational amplifier 10 provides a virtual ground to the first capacitor terminal 7 via the negative feedback path between the first amplifier input 5 and the first amplifier output 15 with the first switch S1 closed.

Since the first capacitor terminal 7 is substantially grounded, the first capacitor C may be charged via the resistive ladder of the resistive converter 61 and the second capacitor terminal 9 such that a voltage across the first capacitor C may be built.

During the predetermined observation time $T_{obs}$, the control circuit 31 may keep on the first switch S1 which was switched on during the predetermined charge time $T_{chr}$. During the predetermined observation time $T_{obs}$, the first capacitor C is charged to the input voltage $V_{in}$ via the first resistor R and the switched on second switch S2.

Resistive digital to analogue converters are relatively simple circuits, commonly used in analogue to digital conversion electronics. By using a resistive converter the design of the filtered sampling circuit 110 may be simplified.

Figure 8:
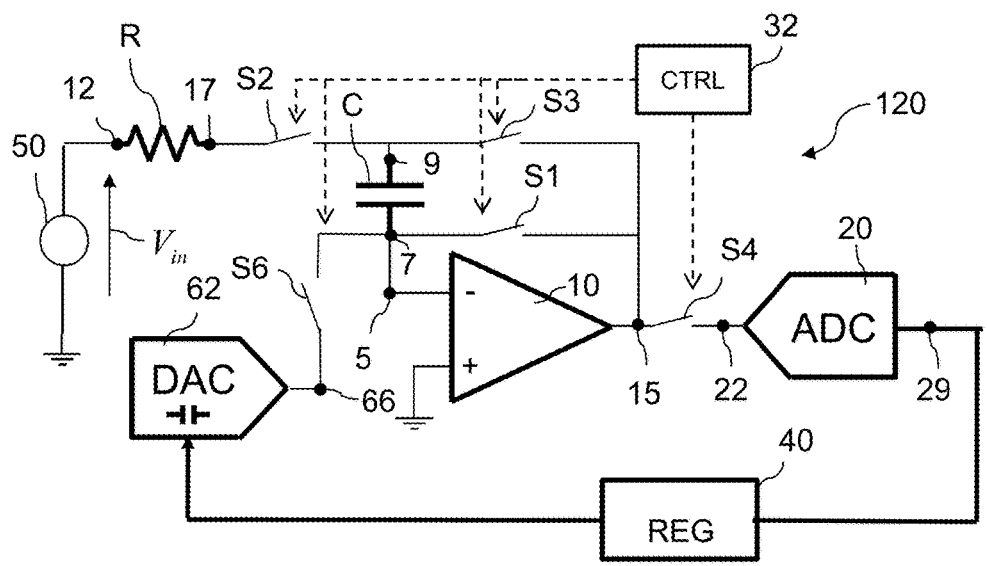

FIG. 8 schematically shows an equivalent circuit of a fourth example of a filtered sampling circuit 120. The filtered sampling circuit 120 differs from the filtered sampling circuit 110 in that it the filtered sampling circuit 120 comprises a sixth switch S6 configured to selectively couple the second converter output 66 to the first capacitor terminal 7.

The filtered sampling circuit 120 comprises a second converter 62. The second converter 62 may be a capacitive converter which output 66 is coupled to the first capacitor terminal 7 and not to the second capacitor terminal 9 as shown in FIG. 7 with reference to the resistive converter 65. For example, the capacitive converter 62 may be a switched-capacitor digital to analogue converter. The switched-capacitor digital to analogue converter may use a capacitive bank wherein electrical charges corresponding to input digital values are stored.

The control circuit 32 is configured to switch on the third switch S3 and the sixth switch S6 e.g. during a predetermined charge time $T_{chr}$ for charging the first capacitor C.

The control circuit 32 may keep the third switch S3 switched on which was switched on during the predetermined reset time $T_{rst}$. While the third switch S3 is switched on, the control circuit 32 may switch on the sixth switch S6 such that the electrical charges stored in the capacitive bank may be transferred to the first capacitor C for pre-charging it. When using a capacitive converter, e.g. a switched-capacitor digital to analogue converter, a better conversion accuracy may be achieved with respect to the embodiment shown in FIG. 7 because the capacitors in the capacitive bank may be fabricated with enhanced accuracy over variations in the fabrication process by using well known layout matching techniques. Further, capacitors may be physically implemented outside active chip areas, e.g. with metal layers on top of the active chip areas, thereby reducing chip area requirement for the filtered sampling circuit 120.

Figure 9:
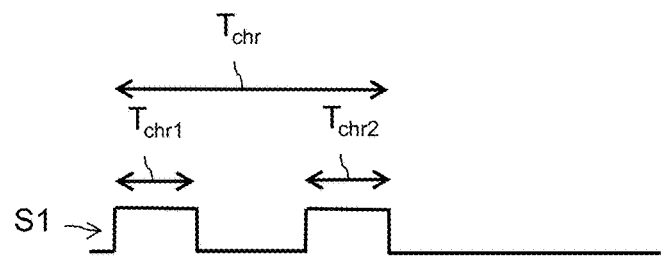

FIG. 9 shows a timing diagram of the predetermined charge time $T_{chr}$.

When a capacitive converter is used, as in the example shown in FIG. 8, the control circuit 32 may be configured, within the predetermined charge time $T_{chr}$, to switch on the third switch S3 and the sixth switch S6 for a first pre-charge time $T_{chr1}$ and for a second pre-charge time $T_{chr2}$. During the first pre-charge time $T_{chr1}$ the first capacitor C may be pre-charged to a voltage value corresponding to a most significant bit of a digital control word stored in the register 40. During the second pre-charge time $T_{chr2}$, additional charge corresponding to the least significant bits of that same digital control word may be added to the first capacitor C. By pre-charging the first capacitor C in two different times with two different voltage values, one corresponding to the most significant bit value of the control register and the other one corresponding to the least significant bit values of that same control register, a capacitive size of the second converter 62, i.e. the size of the capacitive bank implementing it, may be reduced. For example, it may be halved.

Figure 10:
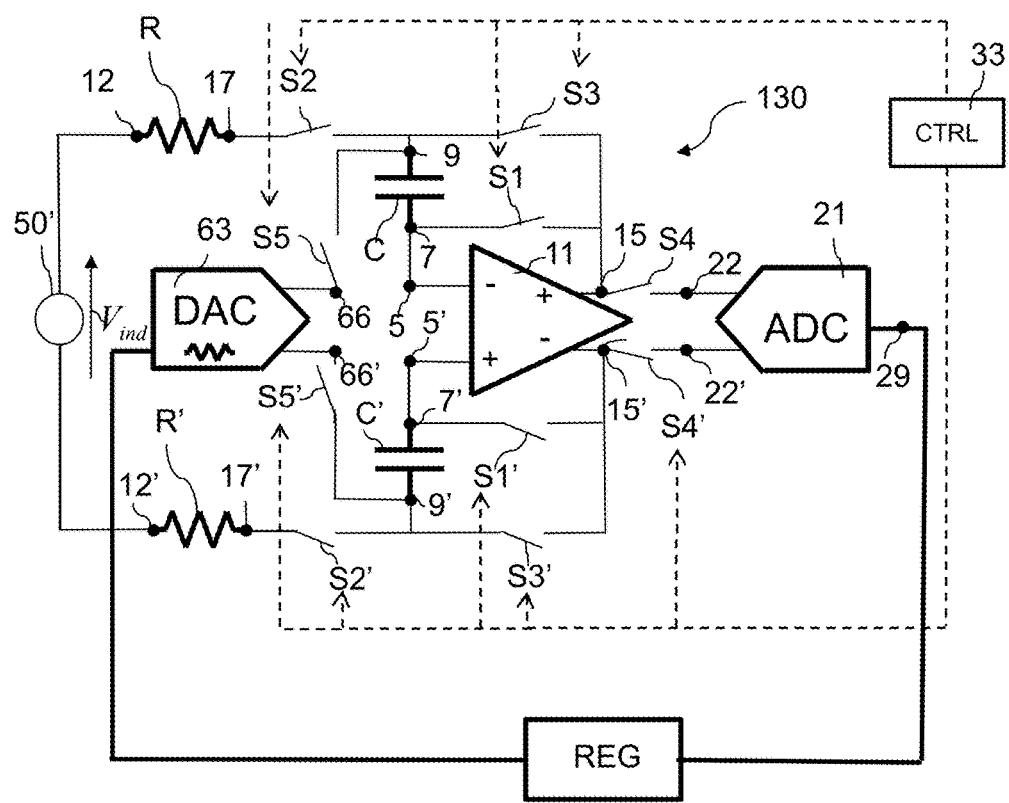

FIG. 10 schematically shows an equivalent circuit of a fifth example of a filtered sampling circuit 130 according to an embodiment of the present invention. The filtered sampling circuit 130 is a differential input-differential output extension of the single ended filtered sampling circuit 110 shown in FIG. 7. The electrical circuit components having the same reference number as in FIG. 7 are herewith with reference to FIG. 10 not described.

The filtered sampling circuit 130 comprises an amplifier 11. The amplifier 11 may be a differential input differential output amplifier comprising in addition to the first amplifier input 5, a second amplifier input 5', and in addition to the first amplifier output 15, a second amplifier output 15'. The filtered sampling circuit 130 further comprises a first converter 21, a second converter 63, a further first switch S1', a second capacitor C', a second resistor R', a further second switch S2', a further third switch S3' and a further fourth switch S4'. The further first switch S1' selectively couples the second amplifier input 5' to the second amplifier output 22'. The second capacitor C' has a third capacitor terminal 7' and a fourth capacitor terminal 9'. The third capacitor terminal 7' is electrically coupled to the second amplifier input 5'. The second resistor R' has a third resistor terminal 12' and a fourth resistor terminal 17'. The first resistor terminal 12 and the third resistor terminal 12' are arranged to receive the differential input voltage signal $V_{ind}$ e.g. generated by the source 50'. The further second switch S2' selectively couples, when switched on, the fourth resistor terminal 17' to the fourth capacitor terminal 9'. The further third switch S3' selectively couples the fourth capacitor terminal 9' to the second amplifier output 15'. The first converter 21 further comprises a further first converter input 22'. The further fourth switch S4' selectively couples the second amplifier output 15' to the further first converter input 22'. The second converter 63 further comprises a further second converter output 66'.

For example, when the second converter 63 is a resistive converter, the control circuit 33 may be configured to electrically couple the further second converter output 66' to the fourth capacitor terminal 9' via the further fifth switch S5'.

The control switch 33 is configured to switch on and off the further switch first switch S1', the further second switch S2', the further third switch S3', the further fourth switch S4' and the further fifth switch S5' in synchronicity with the first switch S1, second switch S2, third switch S3 and fourth switch S4 and fifth switch S5, respectively.

The differential input voltage $V_{ind}$ is inputted via the first resistor R and the further first resistor R' to the respective first capacitor C and the second capacitor C' via the respective second switch S2 and further second switch S2'.

The first converter 21 may be provided with a differential input, i.e. the first converter input 22 and the further first converter input 22', to receive a differential signal output from the amplifier 11 via the fourth switch S4 and the further fourth switch S4', respectively. Alternatively, the fourth switch S4 and the further fourth switch S4' may be implemented in any manner suitable for the specific implementation, e.g. integrated in the first converter 21 or as a single switch at the output of the first converter 21.

By using a fully differential input—differential output amplifier 11, supply voltage noise rejection and common mode voltage noise rejection may be improved. Since one of the object of the filtered sampling circuit is to reduce the high frequency noise, a fully differential solution improve further the characteristics of the filtered sampling circuit.

Figure 11:
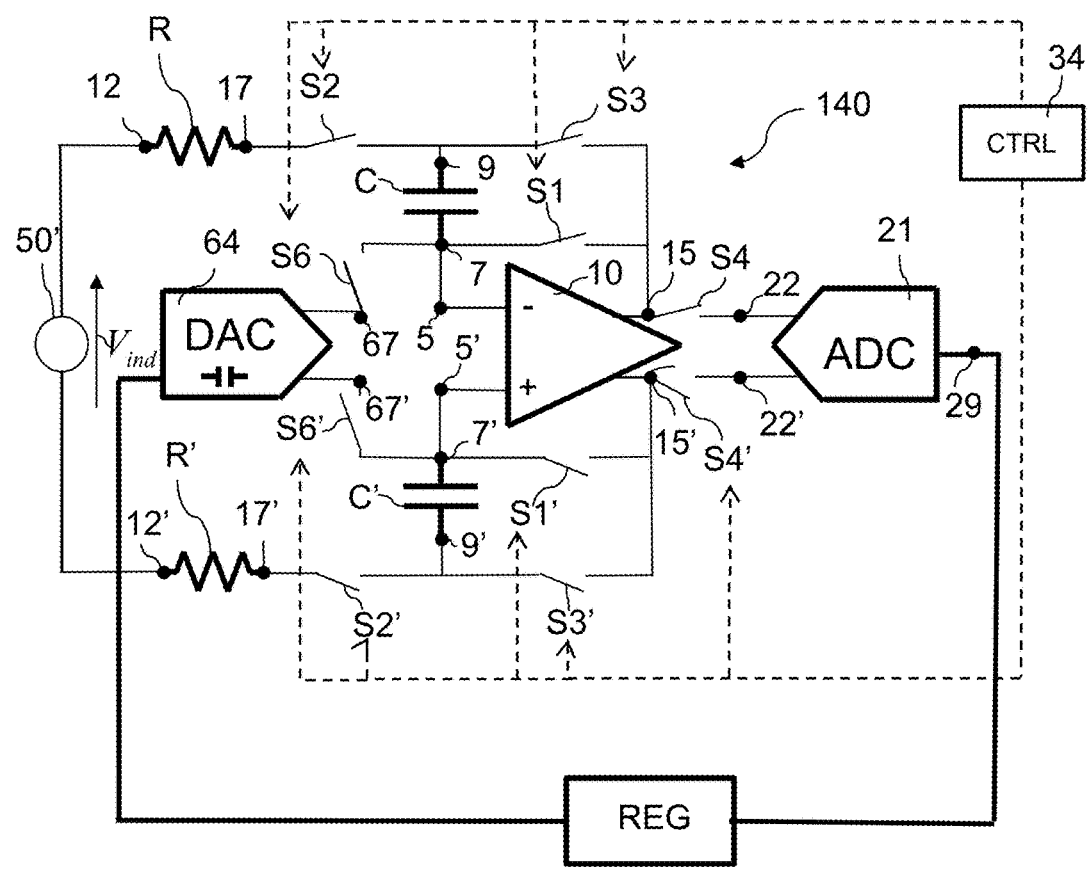

FIG. 11 schematically shows an equivalent circuit of a fifth example of a filtered sampling circuit 140. The filtered sampling circuit 140 is a differential input—differential output extension of the singled-ended filtered sampling circuit 120 shown in FIG. 8. The filtered sampling circuit 140 differs from the filtered sampling stage 130 in that the filtered sampling stage 140 comprises a second converter 64, a control circuit 34 and a further sixth switch S6'.

The second converter 64 comprises a second converter output a 67 and a further second converter output 67'. The further second converter output 67' is electrically coupled to the third capacitor terminal 7' via the further sixth switch S6'. The second converter 64 may be a capacitive converter of the type described with reference to FIG. 8.

The control circuit 34 is configured to switch on and off the further switch first switch S1', the further second switch S2', the further third switch S3', the further fourth switch S4' and the further sixth switch S6' in synchronicity with the first switch S1, second switch S2, third switch S3 and fourth switch S4 and sixth switch S6, respectively.

It is noted that multiplexing between one or more input voltage signals may be implemented in any of the example shown. The first capacitor C in the single-ended examples of FIGS. 1, 5, 7 and 8 or the first capacitor C together with the second capacitor C' of the examples of FIGS. 10 and 11 may be shared between different processing paths, e.g. channels.

Figure 12:
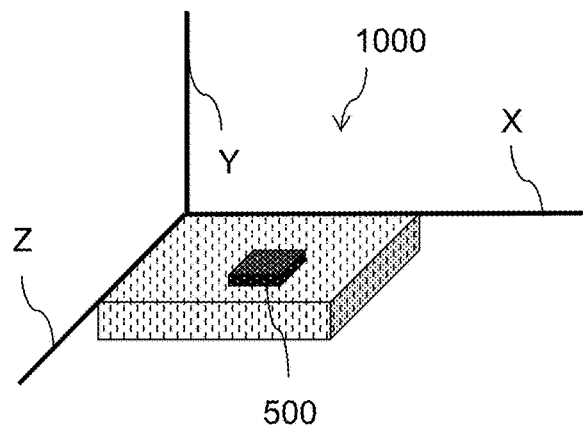

FIG. 12 schematically shows an example of accelerometer 1000. The accelerometer 1000 may comprise any of the filtered sampling circuits 100-140 so far described. The accelerometer 1000 may be suitable for sensing motion in the three dimensional space. For example, motion may be sensed in a first direction along a first axis X, in a second direction along a second axis Y and in a third direction along a third axis Z. The accelerometer 1000 can include an integrated circuit 500 comprising any one of the filtered sampling circuits 100-140 described with reference to the FIGS. 1,5, 7, 8, 10 and 11. The accelerometer 1000 can include, for example, a motion sensor electrically coupled to the first resistor terminal 12 for the single ended examples or resistor terminals 12 and 12' for the differential examples. Since a single filtered sampling circuit according to an embodiment of the invention may be used for all sensed directions X, Y and Z, namely channels X, Y and Z, in the accelerometer 1000, the accelerometer 1000 may be smaller and simpler than prior art accelerometers.

The accelerometer 1000 may be used in any device suitable for a specific application.

For example, the accelerometer 1000 may be used in mobile phones for detecting a person speed or activity, in a gaming console to provide a more realistic gaming experience to the user of the gaming console and in any other suitable application.

Figure 13:
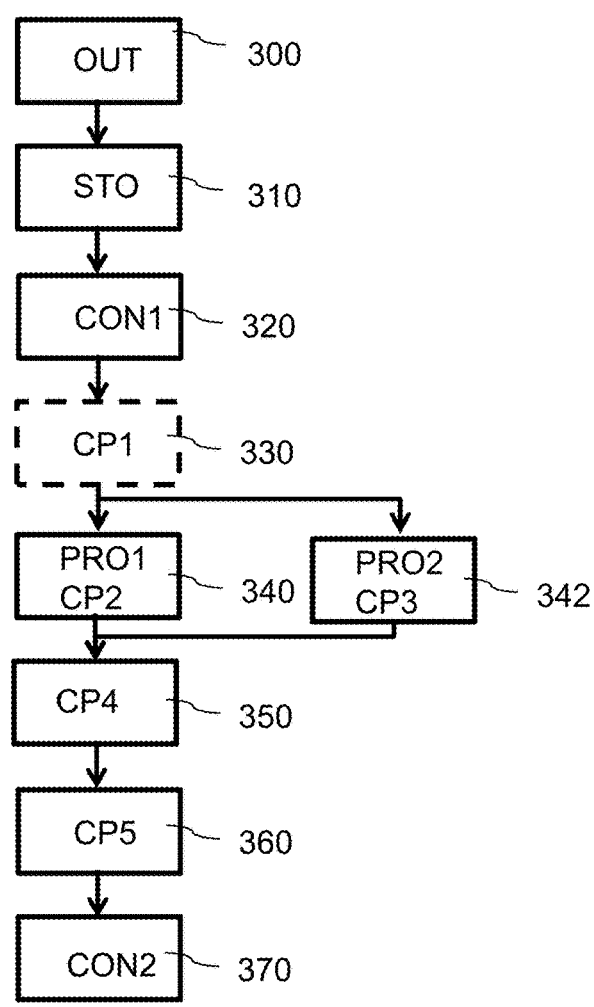

FIG. 13 schematically shows a flow diagram of a method of controlling a filtered sampling circuit. The method will be described with reference to the filtered sampling circuit 100 described with reference to FIG. 1 and the timing diagram of FIG. 2. The filtered sampling circuit may be for example controlled by the circuit controller 30 or by any other suitable controller device.

The method outputs 300 (OUT) a digital signal based on an output amplifier signal for obtaining a last digital value of the output amplifier signal, it stores 310 (STO) the last digital value, it converts 320 (CON1) the last digital value into a corresponding voltage value. Further for charging the first capacitor C to the corresponding voltage value e.g. during the predetermined charge time $T_{chr}$, the method either provides 340 (PRO1) the corresponding voltage value to the second capacitor terminal 9 and electrically couples 340 (CP2) the first capacitor terminal 7 to the first amplifier output 15 e.g. during a predetermined charge time $T_{chr}$, or alternatively provides 342 (PRO2) the corresponding voltage value to the first capacitor terminal 7 and electrically couples 342 (CP3) the second capacitor terminal 9 to the first amplifier output. The method further couples 350 (CP4) the second resistor terminal 17 to the second capacitor terminal 9 and the first amplifier input 7 to the first amplifier output 15 e.g. during a predetermined observation time $T_{obs}$ for providing the input voltage signal to the first capacitor C, electrically couples 360 (CP5) the second capacitor terminal 9 to the amplifier output 15, and converts 370 (CON2) the output signal at the first amplifier output 15 for obtaining a subsequent digital value of the output signal.

In an embodiment, the method may, before charging the first capacitor C 340 or 342, electrically couple 330 (CP1) the first capacitor terminal 7 to the second capacitor terminal 9 for resetting the first capacitor C e.g. during a predetermined reset time $T_{rst}$. The optional reset phase in the method is illustrated in FIG. 13 with a dashed box.

In another embodiment, the method may switch on the fourth switch S4 while the third switch S3 is switched on, for determining the subsequent digital value of the digital signal.

In the foregoing specification, the invention has been described with reference to specific examples of embodiments of the invention. It will, however, be evident that various modifications and changes may be made therein without departing from the scope of the invention as set forth in the appended claims.

The connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the embodiments of the present invention is, for the most part, composed of electronic components and circuits known to those skilled in the art, circuit details have not been explained in any greater extent than that considered necessary, for the understanding and appreciation of the underlying concepts of the embodiments of the present invention and in order not to obfuscate or distract from the teachings of the embodiments of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. For example, in the circuit shown in FIG. 5, in place of the multiplexer 70, a suitable single input voltage signal $V_{in}$ may be used for different channels, wherein the amplitude, frequency and shape of the input voltage signal $V_{in}$ is construed according to the different channels requirements. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A filtered sampling circuit, comprising:
   an amplifier comprising a first amplifier input and a first amplifier output;
   a first switch configured to selectively couple the first amplifier input to the first amplifier output;
   a first capacitor having a first capacitor terminal and a second capacitor terminal, the first capacitor terminal electrically coupled to the first amplifier input;
   a first resistor having a first resistor terminal and a second resistor terminal, the first resistor terminal configured to receive an input voltage signal;
   a second switch configured to selectively couple the second resistor terminal to the second capacitor terminal;
   a third switch configured to selectively couple the second capacitor terminal to the first amplifier output;
   a first converter having a first converter input, electrically coupled to the first amplifier output, and configured to receive an output amplifier signal and a first converter output configured to output a digital signal based on the output amplifier signal;
   a register configured to store a last digital value of the digital signal;
   a second converter configured to convert the stored last digital value into a corresponding voltage value, wherein the second converter comprising a second converter input, electrically coupled to an output of the register, and configured to receive the last digital value and a second converter output configured to output the corresponding voltage value;
a control circuit configured to control the first switch, the second switch, and the third switch, wherein the control circuit is configured, for charging the first capacitor to the corresponding voltage value, to
couple the second converter output to the second capacitor terminal and switch on the first switch, or
couple the second converter output to the first capacitor terminal and switch on the third switch; wherein the control circuit is configured to, before charging the first capacitor, switch on the first switch and the third switch for resetting the first capacitor, and wherein the control circuit is further configured to
switch on the first switch and the second switch for providing the input voltage signal to the first capacitor, and
switch on the third switch for determining a subsequent digital value of the output amplifier signal.

2. The filtered sampling circuit as claimed in claim 1, further comprising:
a fourth switch configured to selectively couple the amplifier output to the first converter input, wherein the control circuit is configured to switch on the fourth switch while the third switch is switched on, for determining the subsequent digital value.

3. The filtered sampling circuit as claimed in claim 2, wherein the control circuit is configured to:
switch on either the first switch or the third switch during a predetermined charge time,
switch on the first switch and the second switch during a predetermined observation time, and
switch on the third switch and the fourth switch during a predetermined conversion time.

4. The filtered sampling circuit as claimed in claim 1, further comprising:
a sixth switch configured to selectively couple the second converter output to the first capacitor terminal, wherein
the second converter is a capacitive converter, and
the control circuit is configured to switch on the third switch and the sixth switch for charging the first capacitor.

5. The filtered sampling circuit as claimed in claim 4, wherein
the control circuit is configured, within a predetermined charge time, to switch on the third switch and the sixth switch for a first pre-charge time for charging the first capacitor to a voltage value corresponding to most significant bits of the first converter and for a second pre-charge time for completing the charge of the first capacitor based on the value of least significant bits of the first converter.

6. The filtered sampling circuit as claimed in claim 1, the filtered sampling circuit further comprising:
a further first switch configured to selectively couple a second amplifier input to a second amplifier output, wherein the amplifier is a differential input differential output amplifier comprising the second amplifier input and the second amplifier output;
a second capacitor having a third capacitor terminal and a fourth capacitor terminal, wherein the third capacitor terminal is electrically coupled to the second amplifier input;
a second resistor having a third resistor terminal and a fourth resistor terminal, wherein the first resistor terminal and the third resistor terminal are configured to receive the input voltage signal;
a further second switch configured to selectively couple the fourth resistor terminal to the fourth capacitor terminal;
a further third switch configured to selectively couple the fourth capacitor terminal to the second amplifier output;
the first converter further comprising a further first converter input electrically coupled to the second amplifier output which is configured to receive the output amplifier signal;
the second converter further comprising a further second converter output configured to output the corresponding voltage value, wherein the control circuit is configured to switch the further first switch, the further second switch, and the further third switch substantially in synchronicity with the first switch, second switch, third switch, respectively.

7. The filtered sampling circuit of claim 6, further comprising:
a further fourth switch configured to selectively couple the second amplifier output to the further first converter input, wherein
the control circuit is configured to switch the further fourth substantially in synchronicity with the fourth switch.

8. The filtered sampling circuit as claimed in claim 6, further comprising:
a sixth switch configured to selectively couple the second converter output to the first capacitor terminal;
a further sixth switch configured to selectively couple the further second converter output to the third capacitor terminal, wherein
the second converter is a capacitive converter,
the control circuit is configured to:
switch on the third switch and the sixth switch for charging the first capacitor, and
switch on the further sixth switch substantially in synchronicity with the sixth switch for charging the second capacitor.

9. The filtered sampling circuit as claimed in claim 1, comprising:
a multiplexer, wherein
the first resistor terminal is configured to receive the input voltage signal and one or more additional input voltage signals via the multiplexer for multiplexing the input voltage signal with the one or more additional input voltage signals.

10. The filtered sampling circuit of claim 9, wherein the input voltage signal and the one or more additional input voltage signals correspond to different signal processing channels.

11. The filtered sampling circuit of claim 9, wherein
the multiplexer is configured to alternately provide the input voltage signal and the one or more additional input voltage signals to the first resistor terminal.

12. The filtered sampling circuit as claimed in claim 1, wherein
the amplifier is an operational amplifier, and
the first amplifier input is an inverting input.

13. An accelerometer for sensing motion in the three dimensional space comprising the filtered sampling circuit as claimed in claim 1, the accelerometer comprising a motion sensor electrically coupled to the first resistor terminal.

14. An integrated circuit device comprising a filtered sampling circuit, the filtered sampling circuit comprising:

an amplifier comprising a first amplifier input and a first amplifier output;

a first switch configured to selectively couple the first amplifier input to the first amplifier output;

a first capacitor having a first capacitor terminal and a second capacitor terminal, the first capacitor terminal electrically coupled to the first amplifier input;

a first resistor having a first resistor terminal and a second resistor terminal, the first resistor terminal configured to receive an input voltage signal;

a second switch configured to selectively couple the second resistor terminal to the second capacitor terminal;

a third switch configured to selectively couple the second capacitor terminal to the first amplifier output;

a first converter having a first converter input electrically coupled to the first amplifier output configured to receive an output amplifier signal and a first converter output configured to output a digital signal based on the output amplifier signal;

a register configured to store a last digital value of the digital signal;

a second converter configured to convert the stored last digital value into a corresponding voltage value, the second converter comprising a second converter input, electrically coupled to an output of the register, and configured to receive the last digital value and a second converter output configured to output the corresponding voltage value;

a control circuit configured to control the first switch, the second switch, and the third switch, wherein the control circuit is configured, for charging the first capacitor to the corresponding voltage value, to
couple the second converter output to the second capacitor terminal and switch on the first switch, or
couple the second converter output to the first capacitor terminal and switch on the third switch; wherein the control circuit is configured to, before charging the first capacitor, switch on the first switch and the third switch for resetting the first capacitor, and wherein the control circuit is further configured to
switch on the first switch and the second switch for providing the input voltage signal to the first capacitor, and
switch on the third switch for determining a subsequent digital value of the output amplifier signal.

\* \* \* \* \*